(12) United States Patent
Kim et al.

(10) Patent No.: US 10,170,641 B2
(45) Date of Patent: Jan. 1, 2019

(54) VERTICAL PIN DIODE

(71) Applicant: ELECTRONICS AND TELECOMMUNICATIONS RESEARCH INSTITUTE, Daejeon (KR)

(72) Inventors: Chulho Kim, Daejeon (KR); Dong Seung Kwon, Daejeon (KR); Bonghyuk Park, Daejeon (KR); Young-Kyun Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 40 days.

(21) Appl. No.: 15/431,926

(22) Filed: Feb. 14, 2017

(65) Prior Publication Data

US 2017/0243985 A1 Aug. 24, 2017

(30) Foreign Application Priority Data

Feb. 23, 2016 (KR) ........................ 10-2016-0021467

(51) Int. Cl.
| | |
|---|---|
| *H01L 29/868* | (2006.01) |
| *H01L 23/528* | (2006.01) |
| *H01L 23/66* | (2006.01) |
| *H01L 27/08* | (2006.01) |
| *H01L 29/06* | (2006.01) |

(52) U.S. Cl.
CPC ........ *H01L 29/868* (2013.01); *H01L 23/5286* (2013.01); *H01L 23/66* (2013.01); *H01L 27/0814* (2013.01); *H01L 29/0649* (2013.01); *H01L 2223/6627* (2013.01)

(58) Field of Classification Search
CPC .... H01L 23/66; H01L 29/868; H01L 23/5286
See application file for complete search history.

(56) References Cited

U.S. PATENT DOCUMENTS

| | | | |
|---|---|---|---|
| 6,617,670 B2 | 9/2003 | Taylor et al. | |
| 2004/0041225 A1* | 3/2004 | Nemoto | ................. H01L 21/263 257/458 |
| 2009/0108457 A1* | 4/2009 | Christensen | ........ H01L 21/6835 257/770 |
| 2012/0001305 A1 | 1/2012 | Peroni et al. | |
| 2015/0002238 A1 | 1/2015 | Ryu et al. | |
| 2015/0228807 A1 | 8/2015 | Kim et al. | |
| 2016/0163654 A1* | 6/2016 | Nakanishi | ............. H01L 23/552 257/140 |

* cited by examiner

*Primary Examiner* — Matthew Reames
*Assistant Examiner* — Wilner Jean Baptiste
(74) *Attorney, Agent, or Firm* — LRK Patent Law Firm

(57) ABSTRACT

A vertical positive-intrinsic-negative (pin) diode includes a semiconductor substrate in which a P-type region, an intrinsic region, and an N-type region are sequentially disposed in a vertical direction to be formed therein, a first electrode formed on one surface of the semiconductor substrate to be in electrical contact with the P-type region, and a second electrode formed on the other surface of the semiconductor substrate to be in electrical contact with the N-type region, wherein the P-type region and the N-type region are respectively disposed in an upper portion and a lower portion of the semiconductor substrate to be opposite to each other.

12 Claims, 6 Drawing Sheets

VERTICAL PIN DIODE

CROSS-REFERENCE TO RELATED APPLICATION(S)

This application claims priority to Korean Patent Application No. 2016-0021467, filed on Feb. 23, 2016 in the Korean Intellectual Property Office (KIPO), the entire content of which is hereby incorporated by reference.

BACKGROUND

1. Field of the Invention

Example embodiments of the present invention relate to a vertical positive-intrinsic-negative (pin) diode, and more particularly, to a vertical pin diode for plasma activation of a solid-state plasma antenna.

2. Description of Related Art

A solid-state plasma antenna refers to an antenna which transmits a signal using variability of a semiconductor substrate (change from a dielectric to a conductor). More specifically, an electrical or optical stimulus is applied to a desired region of a semiconductor substrate, which is normally in a dielectric state, for a desired period of time so that the semiconductor substrate is changed to be in a conductive state (i.e., in a plasma state), and a signal can be transmitted through the conductive region. Directions of beams and a frequency range of radio waves can be easily controlled by appropriately using such variability using a simple structure of the solid-state plasma antenna.

Horizontal pin diodes and vertical pin diodes are known as positive-intrinsic-negative (PIN) diodes included in solid-state plasma antennas. A horizontal pin diode has a structure in which a positive (P) region, an intrinsic (I) region, and a negative (N) region are arranged in a lateral direction on a substrate. An example of such a horizontal pin diode is disclosed in U.S. Pat. No. 6,617,670 entitled "Surface PIN Device." Further, a vertical pin diode has a structure in which a positive (P) region, and intrinsic (I) region, and a negative (N) region are stacked in a vertical direction on a substrate, and an example of such a vertical pin diode is disclosed in each of U.S. Patent Application Publication No. 2012/0001305 A1 entitled "Method of Manufacturing Vertical PIN Diode" and U.S. Patent Application Publication No. 2015/0228807 A1 entitled "Vertical PIN Diode." When compared to horizontal pin diodes of which charges are concentrated on a surface of an intrinsic region thereof and the concentration of charges is decreased in a downward direction from the surface, vertical pin diodes are advantageous in that charges thereof are uniformly dispersed in an intrinsic region thereof.

However, conventional vertical pin diodes are not only difficult to manufacture, but also can cause radio wave interference due to conductive components disposed inside the substrate, particularly intrinsic regions of the substrate. For example, the vertical pin diode disclosed in U.S. Patent Application Publication No. 2012/0001305 A1 entitled "Method of Manufacturing Vertical PIN Diode" is disadvantageous in that the vertical pin diode is difficult to manufacture due to a complicated manufacturing process because metal interconnections are disposed under trenches formed in the substrate. When such a vertical pin diode is applied to an antenna, radio wave interference can be caused by the metal interconnections. In addition, the vertical pin diode disclosed in U.S. Patent Application Publication No. 2015/0228807 A1 entitled "Vertical PIN Diode" is disadvantageous in that not only radio wave interference can be caused due to connection regions passing through intrinsic regions, but also a manufacturing process thereof is difficult.

SUMMARY

Accordingly, example embodiments of the present invention provide a vertical positive-intrinsic-negative (pin) diode which is easily manufactured and has no radio wave interference.

Example embodiments of the present invention also provide a vertical pin diode capable of being applied to a reconfigurable antenna through induction of propagation in a parallel-plate waveguide manner.

In some example embodiments, a vertical pin diode includes a semiconductor substrate in which a P-type region, an intrinsic region, and an N-type region are sequentially disposed in a vertical direction to be formed therein, a first electrode formed on one surface of the semiconductor substrate to be in electrical contact with the P-type region, and a second electrode formed on the other surface of the semiconductor substrate to be in electrical contact with the N-type region, wherein the P-type region and the N-type region are respectively disposed in an upper portion and a lower portion of the semiconductor substrate to be opposite to each other.

The vertical pin diode may further include protection layers formed on the upper and lower surfaces of the semiconductor substrate to cover exposed upper and lower surfaces of the semiconductor substrate. In this case, the protection layers may be formed to overlap an edge of each of the P-type region and the N-type region.

The vertical pin diode may further include a first waveguide layer formed of a metallic material on the protection layer disposed on one surface of the semiconductor substrate, and a second waveguide layer formed of a metallic material on the protection layer disposed on the other surface of the semiconductor substrate. In this case, the vertical pin diode may further include insulating layers formed on the first and second waveguide layers to cover exposed layers of the first and second waveguide layers. Further, the insulating layer may be formed of a nitride or organic material, or may be formed as an air layer.

The vertical pin diode may further include a first interconnection formed on the insulating layer disposed on one surface of the semiconductor substrate to connect the first electrode to a power source, and a second interconnection formed on the insulating layer disposed on the other surface of the semiconductor substrate to connect the second electrode to the power source. In this case, the insulating layer may not be formed on the second waveguide layer, and the second waveguide layer may be formed integrally with the second interconnection layer. Further, the second interconnection layer formed integrally with the second waveguide layer may be grounded.

A plurality of vertical pin diodes, each of which is identical to the vertical pin diode, may be formed in the semiconductor substrate, and isolation trenches may be formed in the semiconductor substrate between the adjacent vertical pin diodes. In this case, a depth of the isolation trench may be equal to or greater than half of a thickness of the semiconductor substrate.

A plurality of vertical pin diodes, each of which is identical to the vertical pin diode, may be formed in the semiconductor substrate, and isolation holes may be formed in the semiconductor substrate between the adjacent vertical pin diodes.

One of the P-type region and the N-type region may be formed on an upper surface of the semiconductor substrate.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Example embodiments of the present invention are disclosed herein. However, specific structural and functional details disclosed herein are merely representative for the purpose of describing example embodiments of the present invention, however, the example embodiments of the present invention may be embodied in many alternate forms and should not be construed as limited to the example embodiments of the present invention set forth herein. In addition, terms and words used in the present specification are terms selected in consideration of functions in the embodiments, and the meaning of the terms may vary depending on a user, the intention or custom of the operator, and the like. Therefore, the terms used in the following embodiments are defined according to definitions of the terms when the terms are specifically defined in the present specification, and unless otherwise defined, the terms have the same meaning as commonly understood by those of ordinary skill in the art to which this invention belongs. Further, in the present specification, a case in which a first material layer is formed on a second material layer should be understood to be not only a case in which the first material layer is formed directly on the second material layer, but also a case in which another third material layer is interposed between the first material layer and the second material layer, unless the context clearly indicates otherwise.

Figure 1A:
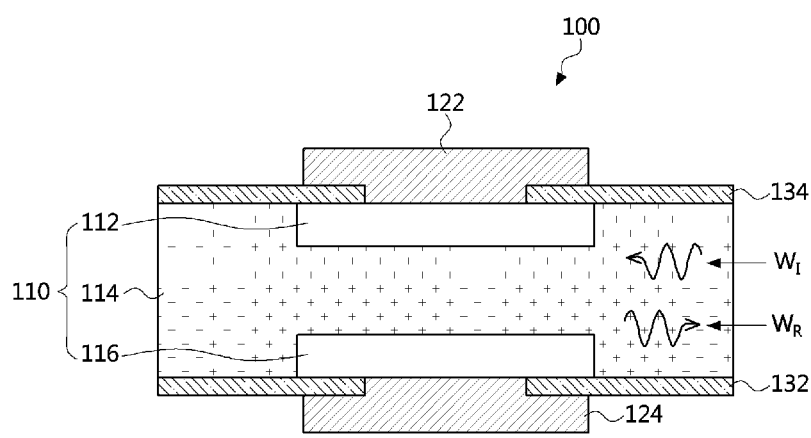
FIG. 1A is a schematic cross-sectional view illustrating a configuration of a vertical positive-intrinsic-negative (pin) diode according to one embodiment of the present invention.

FIG. 1A is a schematic cross-sectional view illustrating a configuration of a vertical positive-intrinsic-negative (pin) diode according to one embodiment of the present invention. Referring to FIG. 1A, a vertical pin diode 100 includes a semiconductor substrate 110 having a P-type region 112, an intrinsic region, 114, and an N-type region 116, and a pair of electrodes 122 and 124. Further, the vertical pin diode 100 may further include protection layers 132 and 134.

In the vertical pin diode 100, conductive regions, i.e., the P-type region 112 and the N-type region 116, are formed in an upper portion and a lower portion of the semiconductor substrate 110, e.g., a silicon (Si) substrate, to be opposite to each other. Although the drawing illustrates that the P-type region 112 is formed on the upper surface and the N-type region 116 is formed on the lower surface, the locations thereof may be reversed. Further, although FIG. 1A illustrates that both of the P-type region 112 and the N-type region 116 have a rectangular shape, this is merely a conceptual illustration for convenience of illustration. Further, it is apparent that the shape of the P-type region 112 need not be the same as that of the N-type region 116 (see FIG. 1B below).

Further, an intrinsic region 114 is interposed between the P-type region 112 and the N-type region 116. That is, the intrinsic region 114 is present in a semiconductor substrate 110 between the P-type region 112 and the N-type region 116 which are vertically disposed and opposite to each other. As a result, the vertical pin diode 100 may include a structure in which the P-type region 112, the intrinsic region 114, the N-type region 116 are sequentially stacked or, contrary to the illustration, may include a structure in which an N-type region, an intrinsic region, a P-type region are sequentially stacked. Further, although boundaries of the intrinsic region 114 are shown as vertical dotted lines in the drawing, this is merely for convenience of description.

The electrodes 122 and 124 are respectively formed on the P-type region 112 and the N-type region 116. More specifically, one electrode 122 of the electrodes 122 and 124 is formed on the upper surface of the semiconductor substrate 110, and the other electrode 124 is formed on the lower surface of the semiconductor substrate 110. Further, the electrodes 122 and 124 are respectively in physical contact with or electrically connected to the P-type region 112 and N-type region 116 so that each of the P-type region 112 and the N-type region 116 are electrically connected to an external device such as a power source or the like. Each of the electrodes 122 and 124 is formed to be connected to an external electrode through a general semiconductor interconnection process, wire bonding, etc. The electrodes 122 and 124 may be formed of an electrically conductive material such as a metal or the like, but is not limited thereto.

Further, the protection layers 132 and 134 may be formed on the upper surface and the lower surface of the semiconductor substrate 110, more exactly, the upper surface and the lower surface of the semiconductor substrate on which the electrodes 122 and 124 are not formed, or the upper surface and the lower surface of the semiconductor substrate 110 on which the P-type region 112 and the N-type region 116 are not formed. The protection layers 132 and 134 serve to protect the semiconductor substrate 110 from being influenced from the outside or predetermined material layers formed on upper and lower surfaces thereof. To efficiently protect the semiconductor substrate 110, it is preferable that each of the protection layers 132 and 134 be formed on the upper and lower surfaces of the semiconductor substrate 110 to overlap edge portions of the P-type region 112 or the N-type region 116. The protection layers 132 and 134 may be an oxide layer including silicon oxide (SiO), but is not limited thereto, and the protection layers 132 and 134 may be formed of another insulating material including silicon nitride (SiN).

In the vertical pin diode 100 illustrated in FIG. 1A, when a positive voltage is applied to the P-type region 112 and a negative voltage is applied to the N-type region 116 or a ground (GND) is connected to the N-type region 116 so as to generate a potential difference between both regions 112 and 116, a current flows in a vertical direction in the intrinsic region 114 when the potential difference is equal to or greater than a threshold voltage. Further, at this time, since a large number of charges flowing through the intrinsic region 114 are similar to free charges of a metal, an incident wave WI is reflected so that a reflected wave WR is generated and discharged.

Figure 1B:
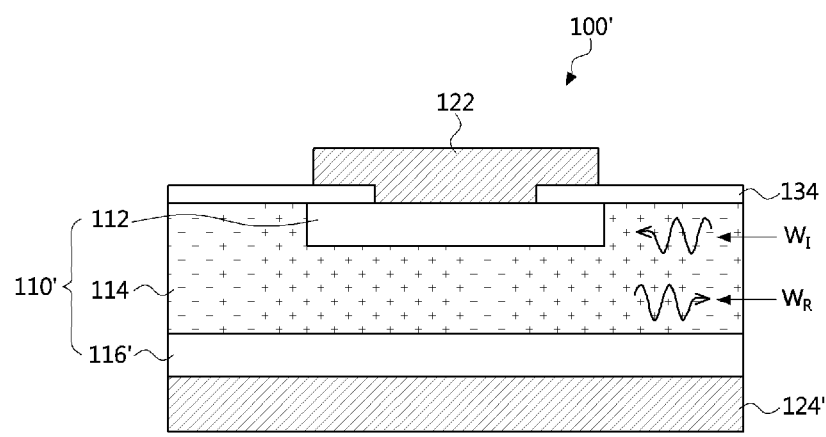
FIG. 1B is a schematic cross-sectional view illustrating a configuration of a vertical pin diode according to another embodiment of the present invention.

FIG. 1B is a schematic cross-sectional view illustrating a configuration of a vertical pin diode according to another embodiment of the present invention. Referring to FIG. 1B, a vertical pin diode 100' includes a semiconductor substrate 110' having a P-type region 112, an intrinsic region 114, and an N-type region 116', a pair of electrodes 122 and 124', and a protection layer 132. There is a difference between the vertical pin diode 100 and the vertical pin diode 100' shown in FIG. 1B in that the N-type region 116' included in the vertical pin diode 100' is not a pattern having a specific shape and is formed on an upper surface of the semiconductor substrate 110'. Further, due to the shape difference between the N-type regions 116 and 116', in the vertical pin diode 100' shown in FIG. 1B, the electrode 124' connected to the N-type region 116' is also formed on the upper surface of the semiconductor substrate 110'. In addition, a component, such as the protection layer 134 shown in FIG. 1A, is not needed in the vertical pin diode 100'. Further, in the vertical pin diode 100' shown in FIG. 1B, the locations of the P-type region 112 and N-type region 116' may be switched like in the vertical pin diode 100 shown in FIG. 1A.

As described above, in the vertical pin diode 100 and 100' shown in FIGS. 1A and 1B, since all components are formed on the upper and lower surfaces of the semiconductor substrate 110 and 110' or formed on the upper surface of the upper and lower surfaces, a manufacturing process thereof is easy. Further, in the case of the vertical pin diode 100' shown in FIG. 1B, since the N-type region 116' does not have a specific pattern and is formed on the upper surface of the semiconductor substrate 110', a manufacturing process thereof is easier. Further, since unnecessary conductive components are not present in the semiconductor substrates 110 and 110', more specifically, inside the intrinsic region 114, radio wave interference cannot occur. In addition, since a current flows in the semiconductor substrates 110 and 110' and a length between the P-type region 112 and the N-type region 116 or 116' is also short, a large number of charges can be generated even using a low voltage.

Figure 2A:
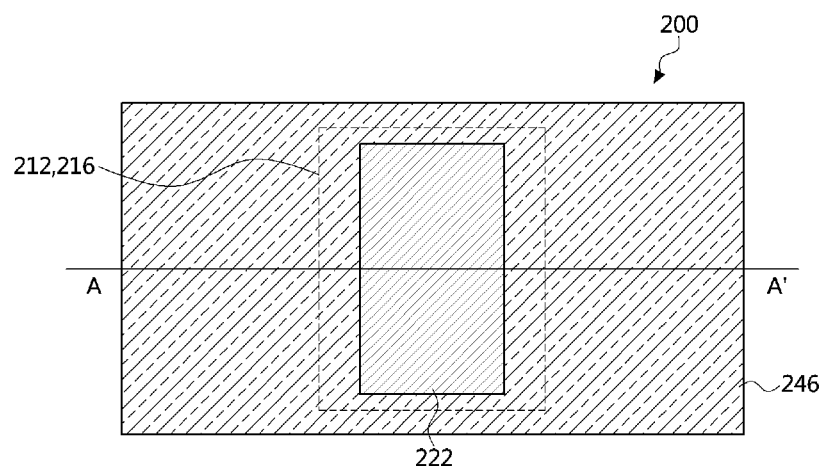
FIG. 2A is a schematic plan view illustrating a configuration of a vertical pin diode according to still another embodiment of the present invention.
Figure 2B:
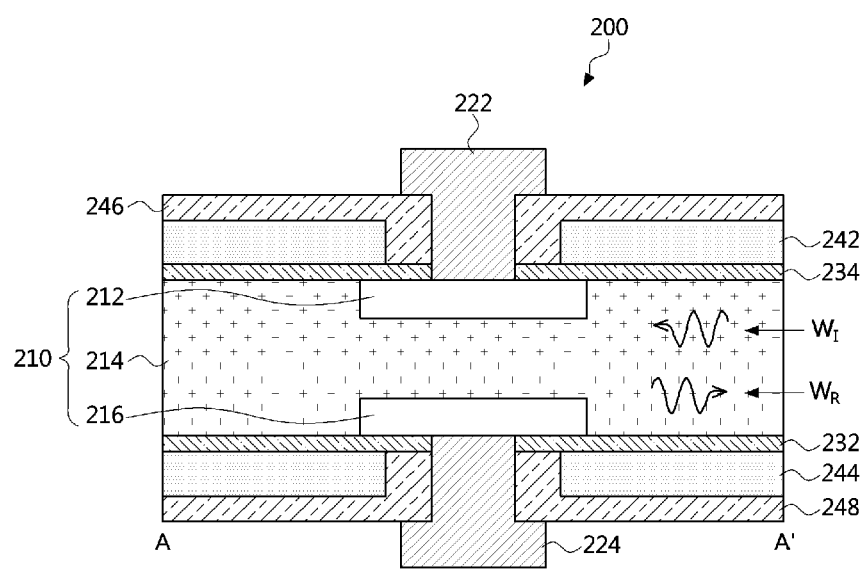
FIG. 2B is a cross-sectional view taken along line AA' shown in FIG. 2A.

FIG. 2A is a schematic plan view illustrating a configuration of a vertical pin diode according to still another embodiment of the present invention, and FIG. 2B is a cross-sectional view taken along line AA' shown in FIG. 2A. A vertical pin diode shown in FIGS. 2A and 2B may be applied to a reconfigurable antenna through induction of propagation in a parallel-plate waveguide manner.

Referring to FIGS. 2A and 2B, a vertical pin diode 200 includes a semiconductor substrate 210 having a P-type region 212, an intrinsic region 214, and an N-type region 216, a pair of electrodes 222 and 224, protection layers 232 and 234, waveguide layers 242 and 244, and insulating layers 246 and 248. A basic structure of the vertical pin diode 200 is based on the vertical pin diode 100 shown in FIG. 1A. Accordingly, to avoid unnecessary repeated descriptions, descriptions of components corresponding to those included in the vertical pin diode 100 shown in FIG. 1A, i.e., the semiconductor substrate 210 having the P-type region 212, the intrinsic region 214, and the N-type region 216, the pair of electrodes 222 and 224, and the protection layers 232 and 234, will be omitted. Further, a dotted quadrangular line shown in FIG. 2A refers to locations of the P-type region 212 and the N-type region 216.

In addition, the vertical pin diode 200 further includes a pair of waveguide layers 242 and 244 to implement a parallel-plate waveguide method. The pair of waveguide layers 242 and 244 are provided to guide radio waves, such as reflected waves and the like, in a specific direction (a side direction of the semiconductor substrate 210 shown in FIGS. 2A and 2B), and may include a metal layer formed of a metallic material. For example, the pair of waveguide layers 242 and 244 may be respectively formed on the protection layers 232 and 234 to have a predetermined thickness.

In addition, the vertical pin diode 200 may further include the insulating layers 246 and 248, and the insulating layers 246 and 248 are provided to insulate the waveguide layers 242 and 244 from other conductive components (e.g., the electrodes 222 and 224) and also protect the vertical pin diode 200 from being physically damaged. The insulating layers 246 and 248 may be formed of an electrical insulating material, such as an organic material or nitride, or may be formed as an air layer in some embodiments.

Figure 3A:
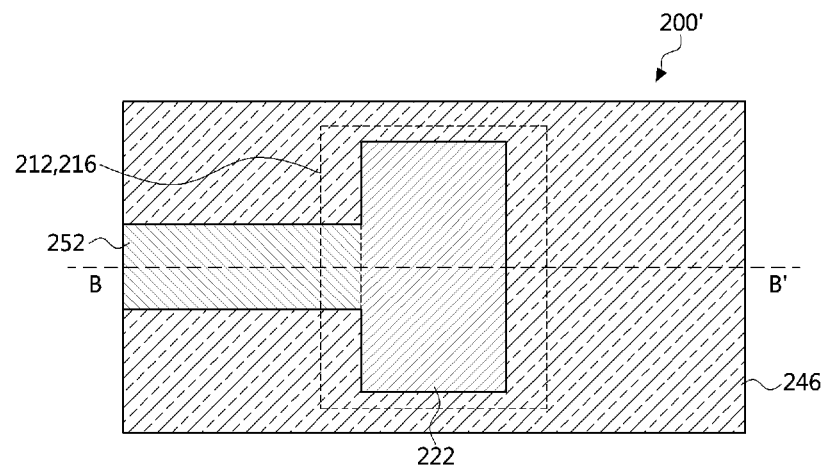
FIG. 3A is a schematic plan view illustrating a configuration of a vertical pin diode according to yet another embodiment of the present invention.
Figure 3B:
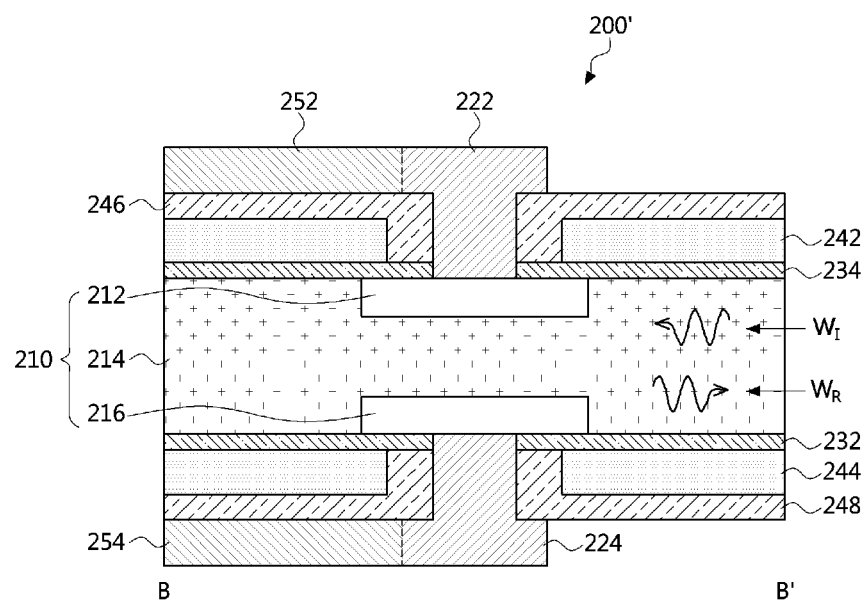
FIG. 3B is a cross-sectional view taken along line BB' shown in FIG. 3A.

FIG. 3A is a schematic plan view illustrating a configuration of a vertical pin diode according to yet another embodiment of the present invention, and FIG. 3B is a cross-sectional view taken along line BB' shown in FIG. 3A. A vertical pin diode 200' shown in FIGS. 3A and 3B has a structure in which interconnections 252 and 254 are additionally formed in the vertical pin diode 200 shown in FIGS. 2A and 2B. Accordingly, to avoid unnecessary repeated descriptions, descriptions of components included in the vertical pin diode 200 shown in FIGS. 2A and 2B, i.e., the semiconductor substrate 210 having the P-type region 212, the intrinsic region 214, and the N-type region 216, the pair of electrodes 222 and 224, the protection layers 232 and 234, the waveguide layers 242 and 244, and the insulating layers 246 and 248 will be omitted. Further, a dotted quadrangular line shown in FIG. 3A also refers to the locations of the P-type region 212 and the N-type region 216.

Referring to FIGS. 3A and 3B, the interconnections 252 and 254 are formed on upper and lower surface of the semiconductor substrate 210 and connected to the electrodes 222 and 224, respectively. More specifically, the interconnection 252 formed on the insulating layer 246 disposed on the upper surface of the semiconductor substrate 210 connects each electrode 222 connected to the P-type region 212 to a power source, and the interconnection 254 formed under the insulating layer 248 disposed under the semiconductor substrate 210 connects each electrode 224 connected to the N-type region 216 to the power source (see FIGS. 5A and 5B). Further, a method of forming such interconnections 252 and 254 is not particularly limited, and a case in which the interconnections 252 and 254 are formed through a semi-conductor interconnection process is illustrated in the drawing.

Further, a case in which the interconnections 252 and 252 are formed as one layer and connected to the power source is illustrated in FIGS. 3A and 3B. In this case, a plurality of vertical PIN diodes including other vertical PIN diodes adjacent to the vertical pin diode 200' are connected to the same power source through the interconnections 252 and 254 formed as one layer. However, the interconnections 252 and 254 may be provided as two or more layers when a general semiconductor interconnection process is used, and in this case, electrodes of the plurality of vertical PIN diodes may be formed to be connected to the power source in various methods without interference.

Figure 4A:
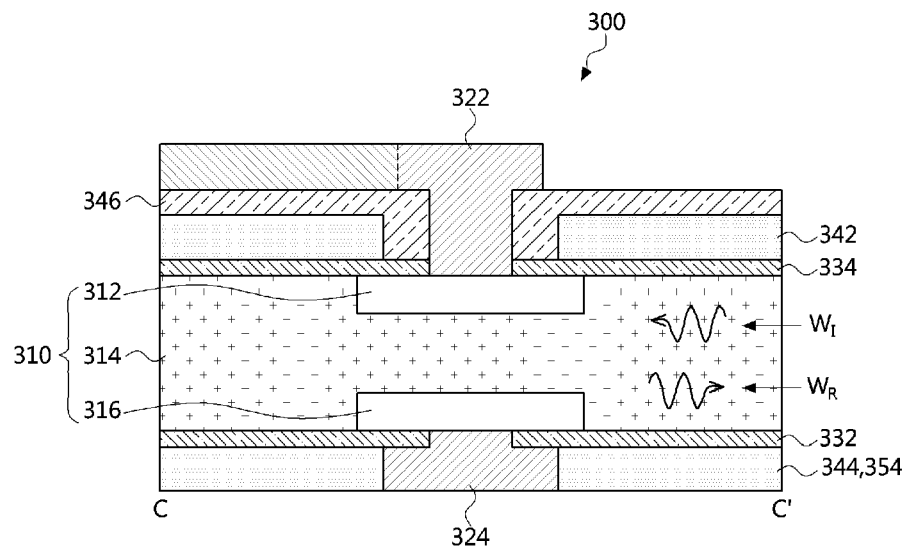
FIG. 4A is a schematic cross-sectional view illustrating a configuration of a vertical pin diode according to yet another embodiment of the present invention.
Figure 4B:
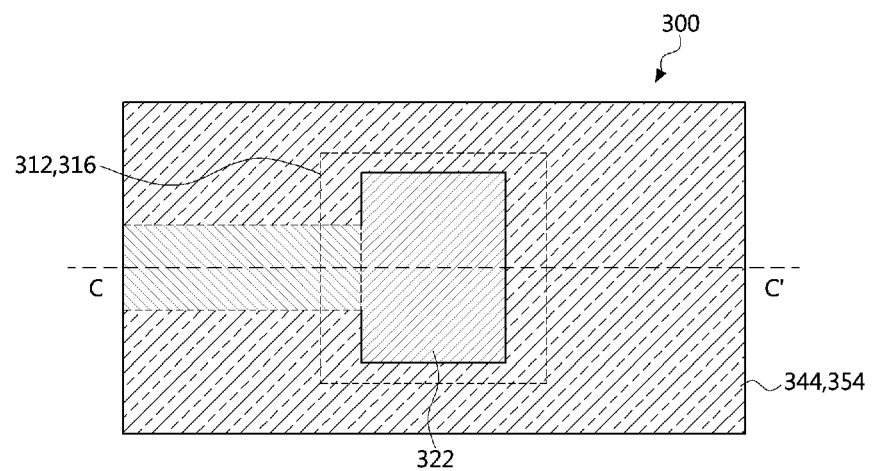
FIG. 4B is a bottom view illustrating the vertical pin diode shown in FIG. 4A.

FIG. 4A is a schematic cross-sectional view illustrating a configuration of a vertical pin diode according to yet another embodiment of the present invention, and FIG. 4B is a bottom view illustrating the vertical pin diode shown in FIG. 4A. That is, the cross-sectional view shown in FIG. 4A corresponds to a cross-sectional view taken along line CC' shown in FIG. 4B, and a direction of line CC' is perpendicular to a direction of line AA' shown in FIG. 2B and a direction of line BB' shown in FIG. 3B. Referring to FIGS. 4A and 4B, a vertical pin diode 300 includes a semiconductor substrate 310 having a P-type region 312, an intrinsic region 314, and an N-type region 316, a pair of electrodes 322 and 324, protection layers 332 and 334, waveguide layers 342 and 344, and an insulating layer 346. That is, the vertical pin diode shown in FIGS. 4A and 4B and the vertical pin diode shown in FIGS. 3A and 3B have a common structure in that the waveguide layers 342 and 344 and the insulating layer 346 are additionally formed in the vertical pin diode shown in FIGS. 2A and 2B. Accordingly, to avoid unnecessary repeated description, descriptions of components included in the vertical pin diode 200 or 200' shown in FIGS. 2A and 2B or FIGS. 3A and 3B, i.e., the semiconductor substrate 310 having the P-type region 312, the intrinsic region 314, and the N-type region 316, the pair of electrodes 322 and 324, the protection layers 332 and 334, the waveguide layers 342 and 344, and the insulating layer 346 will be omitted. Further, a dotted quadrangular line shown in FIG. 4B refers to locations of the P-type region 312 and the N-type region 316, and a T shape rotated by 90 degrees refers to locations of the electrode 322 and an interconnection 352 formed on the semiconductor substrate 310.

Further, the vertical pin diode 300 includes the interconnection 352 and an interconnection 354, and the interconnection 354 formed under the semiconductor substrate 310 among the interconnections 352 and 354 is formed integrally with a waveguide layer 344 formed under the semiconductor substrate 310. That is, the vertical pin diode shown in FIGS. 4A and 4B is different from the vertical pin diode 200' shown in FIGS. 3A and 3B in that the interconnection 354 formed under the semiconductor substrate 310 to be connected to the N-type region 316 is formed integrally with the waveguide layer 344 formed under the semiconductor substrate 310 as an integrated metal layer. When the waveguide layer 344 and the interconnection 354 are formed as the integrated metal layer, there is an advantage in that a process for a portion under the vertical pin diode 300, i.e., a lower surface of the semiconductor substrate 310, is simplified.

In the vertical pin diodes 200 and 200' according to the embodiment of the present invention which are described with reference to FIGS. 2A and 2B and FIGS. 3A and 3B, the pair of electrodes 222 and 224 have a mutually symmetrical structure. Such a structure refers to a vertical pin diode in which a positive voltage and a negative voltage each having a potential difference, which is equal to or greater than a threshold voltage, are respectively applied to the electrode 222 connected to the P-type region 212 and the electrode 224 connected to the N-type region 216. Alternatively, in the vertical pin diode 300 shown in FIGS. 4A and 4B, the pair of electrodes 322 and 324 have an asymmetrical structure, and this may be a structure in which a greater positive voltage than a threshold voltage is applied to the electrode 322 connected to the P-type region 312 but the electrode 324 connected to the N-type region 316 is connected to a ground (GND).

Next, a structure in which a plurality of vertical pin diodes are formed in a semiconductor substrate will be described. The number of vertical pin diodes for implementing a solid-state plasma antenna may be one or more. Actually, a plurality of vertical pin diodes may be needed for forming a reflective surface of a solid-state plasma antenna using a vertical pin diode. For example, a plurality of vertical pin diodes may be formed to be arranged in series or formed to be arranged in an array form in a semiconductor substrate.

Figure 5A:
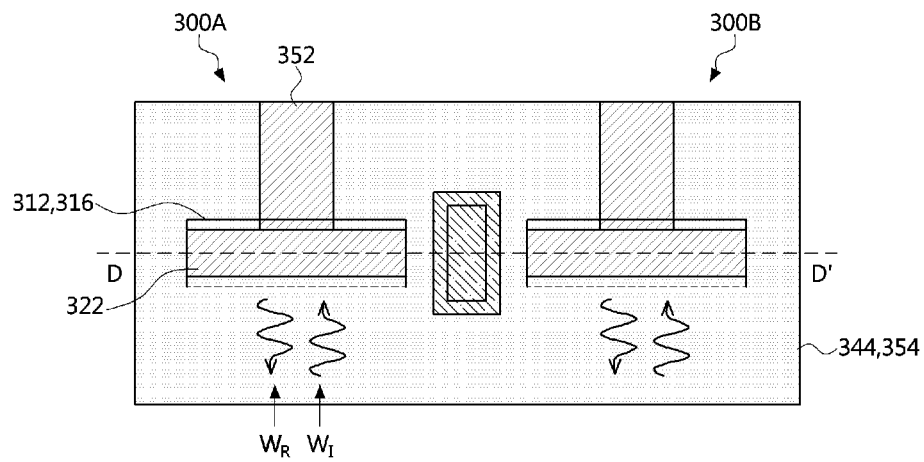
FIG. 5A is a schematic plan view illustrating a configuration of a vertical pin diode according to yet another embodiment of the present invention.
Figure 5B:
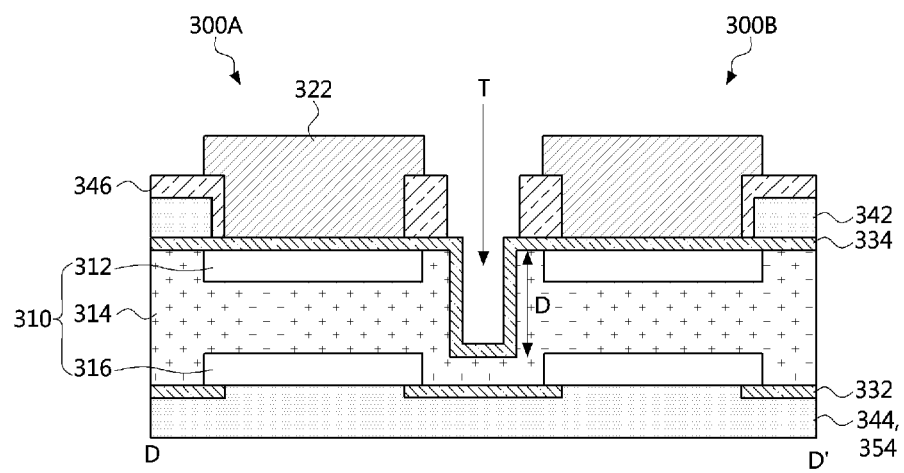
FIG. 5B is a cross-sectional view taken along line DD' shown in FIG. 5A.
Figure 6A:
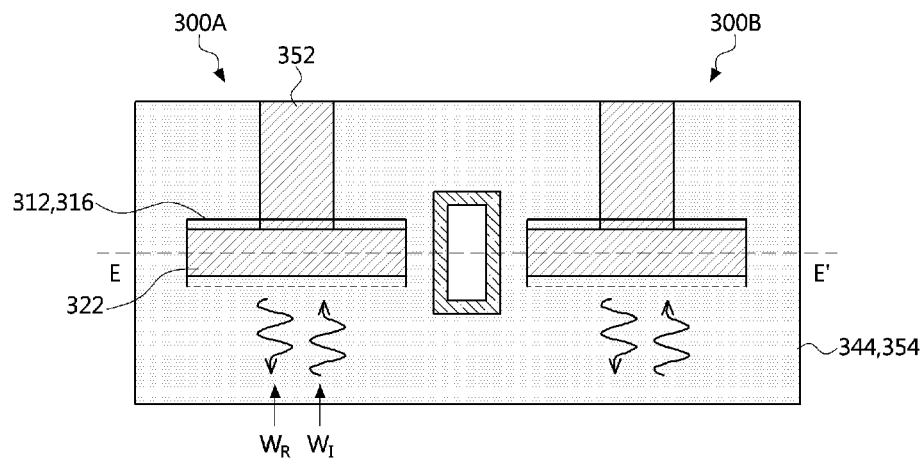
FIG. 6A is a schematic plan view illustrating a configuration of a vertical pin diode according to yet another embodiment of the present invention.
Figure 6B:
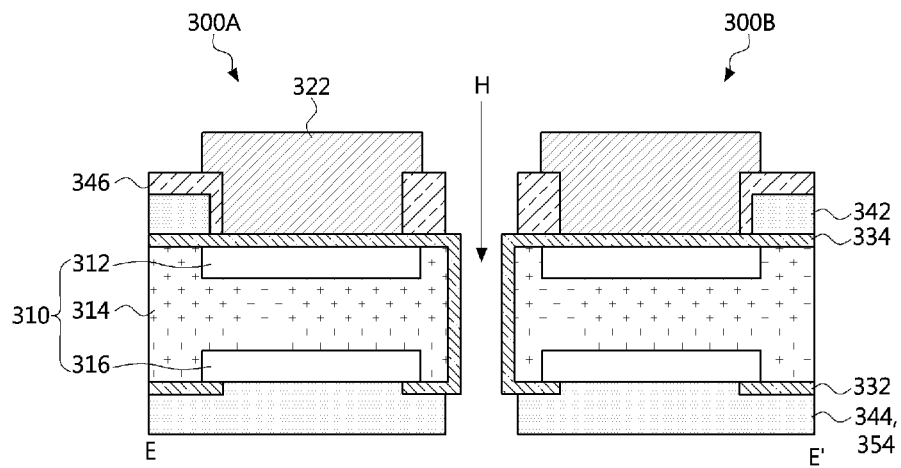
FIG. 6B is a cross-sectional view taken along line EE' shown in FIG. 6A.

As described above, when a solid-state plasma antenna is implemented using a plurality of vertical pin diodes, adjacent vertical pin diodes need to be isolated. That is, although a voltage, which is equal to or greater than a threshold voltage, is applied to the adjacent vertical pin diodes at the same time, a current flowing through an intrinsic region of each of the vertical pin diodes needs to be prevented from flowing into the intrinsic regions of the adjacent vertical pin diodes. A scheme using a trench T is illustrated in FIGS. 5A and 5B as a scheme for isolating a plurality of vertical pin diodes from each other. Further, a scheme using a hole H is illustrated in FIGS. 6A and 6B for isolating a plurality of vertical pin diodes.

FIG. 5A is a schematic plan view illustrating a configuration of a vertical pin diode according to yet another embodiment of the present invention, and FIG. 5B is a cross-sectional view taken along line DD' shown in FIG. 5A. Further, FIG. 6A is a schematic plan view illustrating a configuration of a vertical pin diode according to yet another embodiment of the present invention, and FIG. 6B is a cross-sectional view taken along line EE' shown in FIG. 6A.

In FIGS. 5A and 5B and FIGS. 6A and 6B, two vertical pin diodes 300A and 300B, which are the same as the vertical pin diode 300 shown in FIGS. 4A and 4B, are illustrated to be disposed side by side (here, the interconnection 352 is omitted). Accordingly, to avoid unnecessary repeated descriptions, descriptions of components included in the vertical pin diode 300 shown in FIGS. 4A and 4B, i.e., the semiconductor substrate 310 having the P-type region 312, the intrinsic region 314, and the N-type region 316, the pair of electrodes 322 and 324, the protection layers 332 and 334, the waveguide layers 342 and 344, the insulating layer 346, and the interconnections 352 and 354 will be omitted. Further, a dotted quadrangular line also refers to the locations of the P-type region 312 and the N-type region 316 shown in FIGS. 5A and 6A.

Referring to FIGS. 5A and 5B, an isolation trench T having a predetermined depth D is formed in the semiconductor substrate 310 between the adjacent vertical pin diodes 300A and 300B. Further, referring to FIGS. 6A and 6B, an isolation hole H is formed in the semiconductor substrate 310 between the adjacent vertical pin diodes 300A and 300B to pass through the semiconductor substrate 310. However, this is merely an example, and other structures or methods applied for isolating cells in a semiconductor process may be applied to the embodiment. Further, both of the trench T and the hole H are illustrated to have a quadrangular shape in FIGS. 5A and 6A, this is an example, and the trench T and the hole H may have various shapes such as a circular shape or elliptical shape. Further, distances between the trench T or the hole H and the vertical pin diodes 300A and 300B are also an example.

In the embodiment shown in FIGS. 5A and 5B, it is preferable that the depth D of the isolation trench T be formed deep enough to reach the N-type region 316 in order to effectively block a current flow. In this case, the depth D of the isolation trench T may be greater than a thickness of the intrinsic region 314 and may be substantially the same as the sum of a thickness of the P-type region 312 and the thickness of the intrinsic region 314. It is predicted that the isolation trench T having such a depth D may considerably and effectively block current transmission between two adjacent vertical pin diodes. However, the depth D of the isolation trench T may be controlled in consideration of a level of difficulty, a process time, or the like of an etching process. For example, the depth D of the trench T may be equal to or greater than half of a thickness of the semiconductor substrate 310. In another example, when the depth D of the isolation trench T is the same as the thickness of the semiconductor substrate 310, the isolation trench T may become the isolation hole H shown in FIGS. 6A and 6B. Further, in this case, more isolation between the adjacent vertical pin diodes 300A and 300B may be secured than with the isolation trench T.

Further, exposed surfaces of the isolation trench T and the isolation hole H formed as described above may be protected by forming a predetermined insulating film thereon. For example, a case in which an insulating film is formed integrally with the protection layer 330 is illustrated in FIGS. 5A and 5B and FIGS. 6A and 6B, and in this case, a manufacturing process can be simplified. Alternatively, an insulating film is formed separately from the protection layer 330, or no additional process may be performed so that a natural oxide film or the like becomes the insulating film.

In the vertical pin diode according to the above-described embodiment of the present invention, a current flows in a vertical direction, and not only a length of a channel of the current flow is short, but also the current flows into a semiconductor substrate. Therefore, it is possible to generate a large number of charges when compared with a conventional horizontal pin diode or vertical pin diode. In addition, since there is no conductive structure inside the semiconductor substrate, radio wave interference can be minimized in the case of a solid-state plasma antenna using the vertical pin diode, and a manufacturing process thereof is also easy. In addition, a waveguide layer can be additionally formed on and applied to a reconfigurable antenna through induction of propagation in a parallel-plate waveguide manner.

The above description merely describes embodiments and should not be construed as being limited thereto. The technical concept of the present invention should be specified only by the invention described in the claims, and all technical concepts within the scope of equivalents should be interpreted as being included in the scope of the present invention. Therefore, it is apparent to those skilled in the art that the above-described embodiments may be modified and implemented in various forms.

What is claimed is:

1. A vertical positive-intrinsic-negative (pin) diode comprising:
    a semiconductor substrate in which a P-type region, an intrinsic region, and an N-type region are formed therein to be sequentially disposed in a vertical direction;
    a first electrode formed on one surface of the semiconductor substrate to be in electrical contact with the P-type region;
    a second electrode formed on another surface of the semiconductor substrate to be in electrical contact with the N-type region;
    a first waveguide layer formed of a metallic material on the one surface of the semiconductor substrate; and
    a second waveguide layer formed of a metallic material on the other surface of the semiconductor substrate,
    wherein the P-type region and the N-type region are respectively disposed in an upper portion and a lower portion of the semiconductor substrate to be opposite to each other, and
    wherein the first waveguide layer and the second waveguide layer are layers for guiding radio waves in predetermined direction.

2. The vertical pin diode of claim 1, further comprising protection layers formed on the upper and lower surfaces of the semiconductor substrate to cover exposed upper and lower surfaces of the semiconductor substrate.

3. The vertical pin diode of claim 2, wherein the protection layers are formed to overlap an edge of each of the P-type region and the N-type region.

4. The vertical pin diode of claim 1, further comprising insulating layers formed on the first and second waveguide layers to cover exposed layers of the first and second waveguide layers.

5. The vertical, pin diode of claim 4, wherein the insulating layer is formed of a nitride or organic material, or is formed as an air layer.

6. The vertical pin diode of claim 4, further comprising:
    a first interconnection formed on the insulating layer disposed on one surface of the semiconductor substrate to connect the first electrode to a power source; and
    a second interconnection formed on the insulating layer disposed on the other surface of the semiconductor substrate to connect the second electrode to the power source.

7. The vertical pin diode of claim 6, wherein:
    the insulating layer is not formed on the second waveguide layer; and
    the second waveguide layer is formed integrally with the second interconnection layer.

8. The vertical pin diode of claim 7, wherein the second interconnection layer formed integrally with the second waveguide layer is grounded.

9. The vertical pin diode of claim 1, wherein:
    a plurality of vertical pin diodes, each of which is identical to the vertical pin diode, are formed in the semiconductor substrate; and
    isolation trenches are formed in the semiconductor substrate between the adjacent, vertical pin diodes.

10. The vertical pin diode of claim 9, wherein a depth of the isolation trench is equal to or greater than half of a thickness of the semiconductor substrate.

11. The vertical pin diode of claim 1, wherein:
    a plurality of vertical pin diodes, each of which is identical to the vertical pin diode, are formed in the semiconductor substrate; and
    isolation holes are formed in the semiconductor substrate between the adjacent vertical pin diodes.

12. The vertical pin diode of claim 1, wherein one of the P-type region and the N-type region is formed on an upper surface of the semiconductor substrate.

* * * * *